United States Patent [19]

Lüthje et al.

[11] Patent Number: 5,723,188
[45] Date of Patent: Mar. 3, 1998

[54] PROCESS FOR PRODUCING LAYERS OF CUBIC BORON NITRIDE

[75] Inventors: Holger Lüthje, Halstenbek; Klaus Bewilogua; Simone Daaud, both of Brunswick, all of Germany

[73] Assignee: Fraunhofer-Gesellschaft zur Forderung der Angewandten Forschung E.V., Munich, Germany

[21] Appl. No.: 700,430

[22] PCT Filed: Mar. 3, 1995

[86] PCT No.: PCT/DE95/00315

§ 371 Date: Sep. 4, 1996

§ 102(e) Date: Sep. 4, 1996

[87] PCT Pub. No.: WO95/23879

PCT Pub. Date: Sep. 8, 1995

[30] Foreign Application Priority Data

Mar. 4, 1994 [DE] Germany .................. 44 07 274.0

[51] Int. Cl.$^6$ .................................................. H05H 1/24
[52] U.S. Cl. .................. 427/577; 204/192.1; 427/249; 427/294
[58] Field of Search ..................... 427/569, 580, 427/294, 577, 249; 204/192.1

[56] References Cited

U.S. PATENT DOCUMENTS

| | | | |
|---|---|---|---|
| 4,412,899 | 11/1983 | Beale | 204/192.11 |
| 4,415,420 | 11/1983 | Beale | 204/192.15 |
| 4,683,043 | 7/1987 | Melton et al. | 204/192.15 |
| 4,892,791 | 1/1990 | Watanabe et al. | 428/698 |
| 5,096,740 | 3/1992 | Nakagama et al. | 427/586 |
| 5,137,772 | 8/1992 | Watanabe et al. | 428/212 |

FOREIGN PATENT DOCUMENTS 3810237  10/1988  Germany .

OTHER PUBLICATIONS

Kester et al., "Phase Control of Cubic Boron Nitride Thin Films", Journal of Applied Physics, 72 (2), Jul. 15, 1992, pp. 504–513.
Kester et al., "Phase Evolution in Boron Nitride Thin Films", Journal of Material Research, vol. 8, No. 6, Jun. 1993, pp. 1213–1216.
Tanabe et al., "Influence of Sputtering Target Material on the Formation of Cubic BN Thin Films by Ion Beam Enhanced Deposition", Diamond and Related Materials, 2 (1993), pp. 512–516. (No month avail.).
Murakawa et al., "The Possibility of Coating Cubic BN Films on Various Substrates", Surface and Coatings Technology, 43/44 (1990) pp. 145–153. (No month avail).
Ballal et al., "Structural Characterization of Preferentially Oriented Cubic BN Films Grown on Si (001) Substrates", Thin Solid Films, 224 (1993), pp. 46–51. (No month avail.).
Yokoyama et al., "Effects of a Negative Self–Bias on the Growth of Cubic Boron Nitride Prepared by Plasma Chemical Vapor Deposition", Japanese Journal of Applied Physics, vol. 30, No. 2, Feb. 1991.
Mieno et al., "Preparation of Cubic Boron Nitride Films by RF Sputtering", Japanese Journal of Applied Physics, vol. 29, No. 7, Jul. 1990, pp. 1175–1177.
International Search Report.
International Preliminary Examination Report.

Primary Examiner—Bernard Pianalto
Attorney, Agent, or Firm—Greenblum & Bernstein, P.L.C.

[57] ABSTRACT

Process for producing wear-resistant layers of cubic boron nitride or wear-resistant layers containing cubic boron nitride by sputtering with RF or DC voltage in the operating mode of an unbalanced magnetron, in which the plasma is generated by DC arc discharges or DC operated magnetron cathodes. The initial target for the production of the layer from which the material is removed comprises electrically conductive material containing boron, preferably boron carbide, and, in the process, the reactive process is conducted with the addition of $N_2$ and Ar in such a way that the necessary stoichiometric ratio BiN in the layer can be adjusted.

31 Claims, No Drawings

PROCESS FOR PRODUCING LAYERS OF CUBIC BORON NITRIDE

BACKGROUND OF THE INVENTION

The invention relates to the field of producing wear-resistant layers or producing layers with particular wear properties. It relates to a process for producing wear-resistant layers of cubic boron nitride (cBN) or bonding layers with a high cBN content.

Thermodynamically unstable cBN is distinguished by a high degree of hardness surpassed only by diamond and has other properties which are similar to those of diamond. Particular among these are favorable thermal conductivity, excellent tribological properties, and not least, favorable transparency in the visible range (n=2.2), as well as an extremely large band gap of >6.4 eV, by means of which cBN also possesses a high potential as a semiconductor material.

In the field of manufacturing technology, cBN has the significant advantage in comparison to diamond in that it is inert in relation to steel and consequently permits the processing of workpieces that contain iron. This important production area is not accessible to diamond tools because of the chemical wear on diamond.

Since the 80s, when chiefly Japanese and American scientists fundamentally proved that the cubic phase of boron nitride can also be produced with the aid of plasma-activated processes, there have been a large number of endeavors throughout the world to produce cBN layers.

Thus the manufacture of cBN layers is described, for example, in the "Journal of Applied Physics" 72(2), 15 Jul. 1992, p. 504 and in the "journal of Material Research" Vol. 8, no. 6, June 1993, wherein an ion beam Assisted Deposition System (IBAD) came into use.

Furthermore, in "Diamond and Related Materials" 2 (1993), p. 512, a process is described, which functions with the aid of ion beam cannons, wherein an ion source is used for atomizing the target comprised of boron or hexagonal boron nitride (hBN) and a second ion cannon carries out the bombardment of the film supported on a substrate.

Furthermore, in "Surface and Coating Technology" 43/44 (1990), pp. 145–153, a reactive ion plating process is described, in which boron is vaporized with the aid of an electron beam vaporizer in an Ar/$N_2$ atmosphere, which is additionally ionized. The layer formed is disposed on a substrate retainer with negative potential so that the growing layer is bombarded with the Ar and $N_2$ ions present.

In the process described in "Thin Solid Films" 224 (1993), pp. 46–51, the manufacture of cBN layers is executed with the aid of an ion-assisted laser pulse deposition. An hBN target is used. The ion bombardment is carried out by applying a direct-current potential.

The process described in the "Japanese Journal of Applied Physics" Vol. 30, no. 2, Feb. 1991, pp. 344–348 works with a microwave discharged at the electron cyclotron resonance condition (ECR) wherein boron nitride (BN) is constituted from the gas phase Ar/$N_2$/$B_2H_6$ and an RF bias (radio frequency bias voltage) is applied to the substrate.

Finally, a process for producing cBN-containing layers is also demonstrated in the "Japanese Journal of Applied Physics" Vol. 29, no. 7, July 1990, pp. 1175–1177, in which an hBN target is atomized in an inert high frequency plasma (HF plasma). The substrate is likewise kept at a negative potential with an HF bias so that a bombardment with Ar ions occurs.

For the sake of completeness, please refer to German Patent Disclosure 38 10 237, U.S. Pat. No. 4,412,899, U.S. Pat. No. 4,415,420, U.S. Pat. No. 4,683,043, and U.S. Pat. No. 5,096,740, which likewise disclose different processes for producing cBN layers or cBN-containing layers.

The (Physical Vapor Deposition) processes described in the prior art uniformly use either boron or hexagonal boron nitride (hBN) as the target or vaporization material. With regard to an economical use, all of these processes possessed considerable disadvantages. So with these processes, only relatively small surfaces can be coated at low deposition rates.

The known CVD-ECR (Chemical Vapor Deposition-Electron Cyclotron Resonance) processes have the considerable disadvantage that the deposition can occur only at relatively high substrate temperatures of >600° C. Furthermore, only relatively small substrates can be coated because of the limited expansion of ECR plasma.

In general, essentially PVD processes are used in hard layer manufacturing today, wherein for economical reasons, the plasma generation is carried out with the aid of direct-current arc discharges (ARC process) or with the aid of magnetron cathodes operated on direct current. In addition to significant cost advantages in the industrial field, direct-current operation also has the particular advantage that large-surface layering systems can therefore be realized with them.

With regard to the manufacture of cBN layers or cBN-containing layers, these processes have the disadvantage that the use of an electrically conductive initial target is absolutely required and according to the prior art, it is only possible to produce cBN layers out of electrically non-conductive B or hBN starting materials or a gas phase that contains $B_2H_6$. Consequently, this reasonably-priced process according to the prior art cannot be used for producing cBN layers.

SUMMARY OF THE INVENTION

The object of the present invention includes a process for producing hard and wear-resistant cBN layers or cBN-containing layers that have none of the disadvantages of the prior art, which in addition to a high coating rate, also permits depositing at low substrate temperatures, is not limited exclusively to small substrates, and can be carried out in an economically advantageous and inexpensive manner.

It is also an object of the invention to disclose a process which permits a large-area layering with high deposition rates. Thus, it is also the object of the invention to fulfil the present conditions so that the PVD processes, in which the plasma generation is carried out with the aid of direct-current arc discharges or with the aid of magnetron cathodes operated on direct current, can be used for the production of cBN layers or cBN-containing layers.

As a consequence of this, it is therefore the object of the present invention to disclose an initial target material with an electrically sufficient conductivity from which cBN layers or cBN-containing layers can be produced, as well as the process parameters suited for this.

Finally, it is also the object of the invention to disclose a possible use of the process that is of the type mentioned and is to be proposed.

According to the invention, the objects are attained on the process end as described in claims 1 to 16 and on the employment end as described in claims 17 to 22.

DETAILED DESCRIPTION OF THE INVENTION

Surprisingly, and it was totally unexpected, it was discovered that when correspondingly chosen process conditions are met, cBN layers or cBN-containing layers can also be deposited using boron carbide ($B_4C$) targets that contain approx. 20 at % carbon. A target cleaning phase and a simultaneous ionic sputter-cleaning of the substrate, which sputter-cleaning is divided by means of a mechanical orifice, should advantageously occur before the actual layer depositing.

In the process for producing wear-resistant layers of cBN or cBN-containing wear-resistant layers by means of PVD processes or similar processes, the plasma generation is carried out with the aid of direct-current arc discharges (ARC process) or with the aid of magnetron cathodes operated on direct current. According to the invention, an initial target is used which is made of electrically conductive material and from which the material is removed for layer production. This target is preferably comprised of boron carbide, preferably in the composition range of 90 at % to 70 at % boron and 10 at % to 30 at % carbon (e.g. $B_4C$). In another version of the process, targets of B and/or BN are used as the initial target and are doped with metal (e.g. Ti, Mo, Ta, Cr, Cu, Ni, and/or Al) and/or their borides or nitrides, provided that they have a favorable conductivity. In the process according to the invention, the reactive process is carried out with the addition of Ar and $N_2$ in such a way that the required B:N stoichiometry in the layer can be adjusted.

In a very general way, the process should be carried out so that the carbon content in the cBN layer or cBN-containing layer is reduced to a value <5 at %. In the present invention, a reduced incorporation of carbon into the layer and the required adjustment of the BN ratio is attained so that the process is carried out in an Ar/$N_2$ gas mixture. Analogous to diamond CVD depositing, it would have been expected that an increased oxygen content in the work gas reduces the carbon content in the layer by selectively reacting with it. However, it has turned out that for high percentages of the cubic phase in the layers, just a low partial pressure of oxygen is favorable.

To improve the adhesion of the cBN layer or cBN-containing layer to the substrate, before the actual cBN layer, an additional gradient layer should be deposited on the substrate, without interrupting the vacuum process, e.g. by means of incremental, continuous variation of the process composition and process conditions.

In a very general way, it has turned out to be favorable if the substrate retainer is coated with a layer of BC/BN (boron carbide and/or boron nitride), preferably with a thickness of 0.1 to 0.5 µm.

In addition to other existing possibilities, either the high frequency sputter process or dusting, or the direct-current (DC) magnetron process is used in a suitable manner for the process according to the invention.

When the high frequency sputter process is used, then it is recommended that if the high frequency coupling is carried out on the target end and on the substrate end, or alternative to this, direct current (DC) is coupled to the substrate end, wherein a negative bias voltage in the range of 100 to 1,000 V (e.g. 300 to 500 V) is used, a power per unit area between 3 and 17 W/$cm^2$ is applied to the target (e.g. 6 W/$cm^2$) and a power per unit area between 1 and 11 W/$cm^2$ is applied to the substrate (e.g. 2 W/$cm^2$), the substrate temperature is kept at a temperature in the range between 30° C. and 500° C. (e.g. at an equilibrium temperature of 350° C.), an Ar/$N_2$ gas mixture is used as the process gas, wherein the $N_2$ content in the gas mixture is from 5% to nearly 100% (e.g. 10 to 70%), and the process pressure is set in the range of 1 to 50 µbar (e.g. 20 µbar).

If the DC magnetron process with UBM (unbalanced magnetron) is used, then it is recommended that a power per unit area from 2 to 13 W/$cm^2$ be applied to the target (e.g. 5 W/$cm^2$) and a power per unit area from 0.4 to 8 W/$cm^2$ be applied to the substrate (e.g. 1 W/$cm^2$), that the substrate retainer, to which a bias voltage is to be applied, be supported so that it can rotate, that the process pressure be set in the range from 1 to 10 µbar (e.g. 4 µbar), and that an Ar/$N_2$ gas mixture be used as the process gas, with an $N_2$ content between 10 and nearly 100% (e.g. 50% gas flow). In this version of the process according to the invention, in which the direct current magnetron process is used, it is possible to apply a radio frequency bias voltage (RF bias) or a direct-current bias voltage to the substrate retainer. If a direct current bias voltage is intended to be applied to the substrate retainer, then a bias voltage of 100–800 V is advantageous and if a high frequency bias voltage is intended to be applied to the substrate retainer, then a bias voltage in the range from 100 V to 1,000 V should advantageously be applied (e.g. from 200 V to 500 V).

In a very general way, the process should be suitably carried out with additional magnetic field support in order to consequently encourage the production of the desired layers. This magnetic field support is sensibly carried out in such a way that by means of a coil installed in the recipient, flux densities of approximately 4–7 mT are produced, or the additional magnetic field support is achieved by additional magnets or electromagnetic coils being installed so that a maximal ion current densification is carried out with regard to the substrate.

The process according to the invention is very economical, reasonably priced, and has none of the disadvantages of the prior art, which makes its employment extremely advantageous.

An additional advantage of the process versions of the high frequency sputter process and the direct current magnetron process is that the process heat that exists in these processes is sufficient so that an external heating of the specimens can be omitted.

It should be indicated at this point that it is possible and for certain applications, advantageous, to supplement the process gas mixture with boron-containing gases (e.g. diborane or trimethyl borazine), as well as to use different temperatures of 100° C. to 600° C. in the course of layer production.

The process according to the invention can advantageously be used in different fields of application. For example, it is advantageously used for the manufacture of wear-resistant tools (e.g. for coating components that are subjected to mechanically abrasive and/or adhesive stress, for example disposable inserts, milling cutters, drill bits, pressing and reshaping tools, as well as bearings and/or bearing components), for the manufacture of cubic boron nitride (cBN)-coated pick-ups and components for tape guidance in magnetic tapes, for depositing cBN for electronic applications, in particular for producing electronic components with and without doping, for the manufacture of corrosion protection layers and insulation layers and for the manufacture of optical components with a coating layer and a layer that protects against mechanical stress.

With the embodiment according to the invention, it is consequently possible for the first time to produce cBN layers out of boron-containing targets that are sufficiently electrically conductive and consequently to create the possibility of using the extremely inexpensive and advantageous PVD processes mentioned at the beginning, such as the direct current magnetron process, the high frequency sputter process, and others, to produce cBN layers or cBN-containing layers.

Layers that are comprised of the components B, C, and N are already known in a very general way. Their advantage is comprised among other things in that they have high mechanical strength combined with a favorable optical transparency and therefore demonstrate advantages in relation to the comparably hard amorphous hydrocarbon coatings which in contrast are not transparent in the visible spectral range. A further advantage of the cBN layer lies in its low coefficient of friction μ, which <0.2 and is comparable to diamond layers. Consequently, cBN layers of this type have very favorable sliding properties so that they can be advantageously used for coating components subjected to mechanically abrasive and/or adhesive stress, as well as bearings and/or bearing components. Until now, though, the hard cubic phase has not yet successfully been produced in layers of this kind in a simple, inexpensive manner. cBN and wBN (wurzite phase) are equally sought after. The two phases cBN and wBN, whose densities are identical, are valued equally in that in both modifications, B and N atoms have a coordination number of four and the same short-range order is present. Simple bonds ($sp^3$ state) exist between all B and N atoms. Furthermore, the definition cBN can also be understood to include a nanocrystalline or amorphous material, which has an $sp^3$ hybrid bond for the elements B and N. In the current invention, cBN is understood to mean only the hard phases cBN and wBN.

The process according to the invention is explained in detail in exemplary embodiments below.

Exemplary Embodiments

It has turned out that different processes are suitable for the manufacture of wear-resistant layers of cubic boron nitride.

In the examples embodied here, before the actual layer depositing, a target cleaning phase and a simultaneous ionic sputter-cleaning of the substrate, which sputter-cleaning is divided by means of a mechanical orifice (shutter). In the exemplary embodiments below, the shutters were opened during layer production.

Silicon wafers (orientations 100 and 111) were used as substrates, as well as steel specimens of 100 Cr6, HSS (high speed steel), hard metals, molybdenum, and stainless steel.

1. HF Sputter Process (High Frequency Dusting Process)

A process in which the layer is produced in a high frequency diode sputtering system has turned out to be particularly advantageous. In so doing, the high frequency coupling on the target end and also on the substrate end is carried out, wherein negative bias voltages in the range from 300–500 V are used. There is also the possibility of coupling direct current (DC=direct current) to the substrate end. The desired properties of the layers to be produced are obtained by using a conductive target made of $B_4C$. For this, powers per unit area of 6 W/cm² are applied to the target. Powers of 2 W/cm² are used on the substrate electrodes, wherein the electrodes, with a diameter of approx. 170 mm, are disposed opposite each other with a spacing of approximately 100 mm. The substrate electrodes can be coated with $B_4C$ or other B-containing materials. However, a steel plate or a different metal can also be used. The process is suitably carried out in a magnetic field-supported manner in such a way that flux densities of approximately 4 to 7 mT are produced by means of a coil installed in the recipient and the production of the desired layers is consequently encouraged. Heating of the specimens is not required. Due to the process heat, the substrates assume an equilibrium temperature of up to 350° C. during layering.

The cubic boron nitride layer is produced using a gas mixture of Ar and $N_2$, wherein the process pressure was 20 μbar. The $N_2$ content in the gas mixture fell in a range from 50–70% of the total flow. A cBN layer 0.8 μm thick, having the typical properties of the hard cubic boron nitride phase was achieved with this process.

2. DC Magnetron Process (Direct Current Magnetron Process)

Another manufacturing process for depositing wear-resistant layers of cubic boron nitride on a substrate exists according to the invention through the use of UBM systems (UBM=unbalanced magnetron) that operate on direct current. In this case, the substrate retainer can be operated with both an RF bias and a DC bias. A commercial system was used, which had a vertically disposed magnetron cathode with additional coils for an unbalanced sputtering operation (UBM). The $B_4C$ target used had dimensions of 254 mm×127 mm. The substrate retainer, which was comprised of a stainless steel plate, was disposed with a spacing of 80 mm to 150 mm. The substrate retainer could be rotated so that intermediary layers could also be deposited during a vacuum cycle, in which the substrate retainer was passed in front of a second magnetron cathode, which was disposed offset by 90°.

In comparison to the preceding exemplary embodiment, having electrodes operated with high frequency, here significantly higher deposition rates are achieved. Furthermore, relatively large substrates can be coated with this kind of system. Additional magnet coils and if need be, bar magnets can be suitably installed so that a maximal ion current densification is carried out with regard to the substrate.

$B_4C$ was used as the target material here, wherein a power per unit area of 5 W/cm² was applied to the target.

The two possible variants (substrate retainer on a high frequency bias or a direct current bias) were carried out with the following parameters:

Substrate retainer on high frequency bias: in this case, a high frequency power of 300 W was applied to the substrate. A bias voltage of 200 V to 500 V resulted from this. The substrate retainer, into which high frequency is fed, is spaced apart from the target by 80 to 150 mm. In this process, an additional magnetic field support was carried out by additional magnets being installed in such a way that a maximal ion current densification occurred with regard to the substrate. The process pressure lies in the region of $4 \cdot 10^{-3}$ mbar, wherein an Ar/$N_2$ mixture is used here as well. The $N_2$ contents are around 80% (flow).

Substrate retainer on direct current bias: a variant of the cBN process is comprised in operating the DC magnetron system with direct current on the substrate end as well. In this case, the substrate retainer is comprised of stainless steel or other suitable metals. The other settings remain the same in comparison to the RF bias example described. A DC bias voltage of 500 V is applied only to the substrate retainer. It turned out that layer thicknesses of up to 6 μm can be produced in this manner out of highly-insulating cBN layers.

As a variant of this exemplary embodiment, before the layering, an intermediary layer of a conductive Ti B(N) and/or $B_4C$, which is 100 nm to 1.000 nm thick, is deposited on the substrate retainer and the substrate mounted on it.

Very limited thicknesses of a comparably conductive layer can also be deposited in the meantime for the manufacture of still thicker cBN layers.

With the direct current magnetron example, an external heating of the specimens can also be omitted.

We claim:

1. A process for producing a wear-resistant layer of cubic boron nitride on a substrate, comprising generating plasma by sputtering a target of electrically conductive material containing boron carbide in the presence of a process gas comprising $N_2$ and Ar, and depositing a cubic boron nitride layer on a substrate.

2. The process according to claim 1, wherein said target comprises boron carbide having a composition range of 70–90 atom % boron and 10–30 atom % carbon.

3. The process according to claim 2, wherein said boron carbide comprises $B_4C$.

4. The process according to claim 1, wherein the carbon content of the deposited layer is below 5 atom %.

5. The process according to claim 1, further comprising depositing a priming prior to the layer of cubic boron nitride.

6. The process according to claim 5, wherein said layer is produced under a vacuum, and the priming is deposited by incrementally changing process gas composition and process conditions without vacuum interruption.

7. The process according to claim 5, wherein said layer is produced under a vacuum, and the priming is deposited by continually changing process gas composition and process conditions without vacuum interruption.

8. The process according to claim 1, wherein, prior to depositing the cubic boron nitride layer, coating the substrate with a layer of boron carbide/boron nitride at a thickness of from 0.1 to 0.5 μm.

9. The process according to claim 1, wherein the sputtering comprises high frequency sputtering including high frequency coupling between the target and the substrate at a negative bias voltage from 100 to 1,000 V, power per unit area between 3 and 17 $W/cm^2$ is applied to the target, power per unit area between 1 and 11 $W/cm^2$ is applied to the substrate, the substrate is maintained during layering at a temperature between 30° C. and 500° C., the process gas comprises an $Ar/N_2$ gas mixture containing 5% to nearly 100% $N_2$, and a process pressure of between 1 and 50 μbar.

10. The process according to claim 9, wherein direct current is applied to the substrate.

11. The process according to claim 9, wherein power per unit area of 6 $W/cm^2$ is applied to the target, power per unit area of 2 $W/cm^2$ is applied to the substrate, the substrate is maintained during layering at a temperature of 350° C., the process gas comprises an $Ar/N_2$ gas mixture containing 10 to 70% $N_2$, and a process pressure of 20 μbar.

12. The process according to claim 1, wherein the sputtering comprises direct current magnetron sputtering while operating in an unbalanced magnetron mode, power per unit area from 2 to 13 $W/cm^2$ is applied to the target, power per unit area from 0.4 to 8 $W/cm^2$ is applied to the substrate, the process gas comprises an $Ar/N_2$ gas mixture containing 10% to nearly 100% $N_2$, and a process pressure of between 1 and 10 μbar.

13. The process according to claim 12, wherein the substrate is rotatably supported.

14. The process according to claim 13, wherein a bias voltage of 100–800 V of direct current is applied to the substrate.

15. The process according to claim 13, wherein a bias voltage of 100–1000 V of high frequency is applied to the substrate.

16. The process according to claim 13, wherein power per unit area of 5 $W/cm^2$ is applied to the target, power per unit area of 1 $W/cm^2$ is applied to the substrate, the process gas comprises an $Ar/N_2$ gas mixture containing 50% $N_2$, and a process pressure of 4 μbar.

17. The process according to claim 11, wherein the process is operated in a magnetic field supported manner, and a coil with flux densities of 4 to 7 mT is installed in a recipient.

18. The process according to claim 17, comprising applying additional magnetic field support by utilizing additional magnets or electromagnetic coils so that a maximal ion current density is achieved on the substrate.

19. The process according to claim 1, wherein said process gas additional includes boron-containing gas.

20. The process according to claim 19, wherein said boron-containing gas comprises at least one member selected from the group consisting of diborane and trimethyl borazine.

21. The process according to claim 1, wherein said depositing a cubic boron nitride layer is performed at a temperature of 100° C. to 600° C.

22. The process according to claim 1, wherein said substrate comprises a tool.

23. The process according to claim 1, wherein said substrate comprises a substrate that is subject to at least one of mechanical abrasion and adhesive stress.

24. The process according to claim 1, wherein said substrate comprises a bearing.

25. The process according to claim 1, wherein said substrate comprises a bearing component.

26. The process according to claim 1, wherein said substrate comprises a pick-up.

27. The process according to claim 1, wherein said substrate comprises a component for tape guidance in magnetic tapes.

28. The process according to claim 1, wherein said substrate comprises an electronic component with and without doping.

29. The process according to claim 1, wherein said layer of cubic boron nitride comprises a corrosion protection layer.

30. The process according to claim 1, wherein said layer of cubic boron nitride comprises an insulation layer.

31. The process according to claim 1, wherein said substrate comprises an optical component layered with a coating layer and a layer that protects against mechanical stress.

* * * * *